US012777572B2

(12) United States Patent
Igarashi et al.

(10) Patent No.: US 12,777,572 B2
(45) Date of Patent: Oct. 27, 2026

(54) PRINTED WIRING BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Shun Igarashi, Osaka (JP); Ichiro Kuwayama, Osaka (JP); Suguru Yamagishi, Osaka (JP); Hiroshi Ueda, Osaka (JP); Satoshi Kiya, Shiga (JP)

(73) Assignees: Sumitomo Electric Industries, Ltd., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 182 days.

(21) Appl. No.: 18/711,596

(22) PCT Filed: Nov. 22, 2022

(86) PCT No.: PCT/JP2022/043213
§ 371 (c)(1),
(2) Date: May 19, 2024

(87) PCT Pub. No.: WO2023/095797
PCT Pub. Date: Jun. 1, 2023

(65) Prior Publication Data

US 2025/0016909 A1 Jan. 9, 2025

(30) Foreign Application Priority Data

Nov. 24, 2021 (JP) ................................. 2021-190210

(51) Int. Cl.
*H05K 1/00* (2006.01)
*H05K 1/02* (2006.01)
(Continued)

(52) U.S. Cl.
CPC ......... *H05K 1/0218* (2013.01); *H05K 1/0298* (2013.01); *H05K 3/0026* (2013.01);
(Continued)

(58) Field of Classification Search
CPC ............... H05K 1/0218; H05K 1/0298; H05K 3/0026; H05K 3/4661; H05K 2201/09227;
(Continued)

(56) References Cited

U.S. PATENT DOCUMENTS 6,133,805 A * 10/2000 Jain ........................ H01P 3/088 333/1
2018/0108965 A1* 4/2018 Huang .................... H01P 3/006
(Continued)

FOREIGN PATENT DOCUMENTS

JP 2006-24618 A 1/2006
JP 2018-200982 A 12/2018
(Continued)

*Primary Examiner* — Pete T Lee
(74) *Attorney, Agent, or Firm* — Renner, Otto, Boisselle & Sklar, LLP

(57) ABSTRACT

A printed wiring board includes: a first insulating layer having a first main surface and a second main surface opposite to the first main surface; a first wire pattern, a second wire pattern and a first ground pattern disposed on the second main surface and extending along a first direction in a plan view; a second ground pattern disposed on the first main surface; an adhesive layer disposed on the second main surface so as to cover the first wire pattern, the second wire pattern and the first ground pattern; a second insulating layer disposed on the adhesive layer and having a third main surface facing the adhesive layer side and a fourth main surface opposite to the third main surface; a third ground pattern disposed on the fourth main surface; and a first conductor layer.

6 Claims, 14 Drawing Sheets

(51) Int. Cl.
*H05K 3/00* (2006.01)
*H05K 3/46* (2006.01)

(52) U.S. Cl.
CPC ...................... *H05K 3/4661* (2013.01); *H05K 2201/09227* (2013.01); *H05K 2201/09236* (2013.01); *H05K 2201/09545* (2013.01); *H05K 2201/09609* (2013.01); *H05K 2201/09618* (2013.01)

(58) Field of Classification Search
CPC .......... H05K 2201/09236; H05K 2201/09545; H05K 2201/09609; H05K 2201/09618
See application file for complete search history.

(56) References Cited

U.S. PATENT DOCUMENTS

2020/0015351 A1* 1/2020 Takano ................ H05K 3/4644
2023/0019563 A1 1/2023 Nitta et al.

FOREIGN PATENT DOCUMENTS

WO 2019/116860 A1 6/2019
WO 2021/230215 A1 11/2021

* cited by examiner

PRINTED WIRING BOARD

TECHNICAL FIELD

The present disclosure relates to a printed wiring board. The present application claims the priority based on Japanese Patent Application No. 2021-190210 filed on Nov. 24, 2021. The entire contents of the description in this Japanese patent application are incorporated herein by reference.

BACKGROUND ART

Japanese Patent Laying-Open No. 2006-24618 (PTL 1) describes a wiring board. The wiring board described in PTL 1 has a first dielectric layer, a first wire pattern, a second wire pattern and a coplanar ground pattern, a second dielectric layer, a first ground pattern and a second ground pattern, and a conductor layer.

The first dielectric layer has a first main surface and a second main surface opposite to the first main surface. The first wire pattern, the second wire pattern and the coplanar ground pattern are disposed on the second main surface. The first wire pattern, the second wire pattern and the coplanar ground pattern extend along a first direction. The coplanar ground pattern is disposed between the first wire pattern and the second wire pattern in a second direction orthogonal to the first direction.

The second dielectric layer is disposed on the second main surface so as to cover the first wire pattern, the second wire pattern and the coplanar ground pattern. The second dielectric layer has a third main surface facing the second main surface side, and a fourth main surface opposite to the third main surface. The first ground pattern and the second ground pattern are disposed on the first main surface and on the fourth main surface, respectively.

A plurality of through-holes are formed in the wiring board described in PTL 1. The plurality of through-holes are arranged along the first direction in a plan view. The through-holes pass through the first dielectric layer, the second dielectric layer and the coplanar ground pattern. Each of the through-holes has a circular shape in a plan view. Each of the through-holes is filled with the conductor layer. The coplanar ground pattern is electrically connected to the first ground pattern and the second ground pattern by the conductor layer. In the wiring board described in PTL 1, crosstalk between the first wire pattern and the second wire pattern is suppressed by the conductor layer.

CITATION LIST

Patent Literature

PTL 1: Japanese Patent Laying-Open No. 2006-24618

SUMMARY OF INVENTION

A printed wiring board of the present disclosure includes: a first insulating layer having a first main surface and a second main surface opposite to the first main surface; a first wire pattern, a second wire pattern and a first ground pattern disposed on the second main surface and extending along a first direction in a plan view; a second ground pattern disposed on the first main surface; an adhesive layer disposed on the second main surface so as to cover the first wire pattern, the second wire pattern and the first ground pattern; a second insulating layer disposed on the adhesive layer and having a third main surface facing the adhesive layer side and a fourth main surface opposite to the third main surface; a third ground pattern disposed on the fourth main surface; and a first conductor layer. The first ground pattern is located between the first wire pattern and the second wire pattern in a second direction orthogonal to the first direction, and is spaced apart from the first wire pattern and the second wire pattern. A plurality of first through-holes passing through the first insulating layer, the first ground pattern, the second ground pattern, the adhesive layer, the second insulating layer, and the third ground pattern in a thickness direction are formed in the first insulating layer, the first ground pattern, the second ground pattern, the adhesive layer, the second insulating layer, and the third ground pattern. The plurality of first through-holes are spaced apart from each other and arranged to line up along the first direction. The first conductor layer is disposed on an inner wall surface of each of the plurality of first through-holes, and is electrically connected to the first ground pattern, the second ground pattern and the third ground pattern. A width of each of the plurality of first through-holes in the first direction is greater than a width of each of the plurality of first through-holes in the second direction.

DETAILED DESCRIPTION

Figure 1:
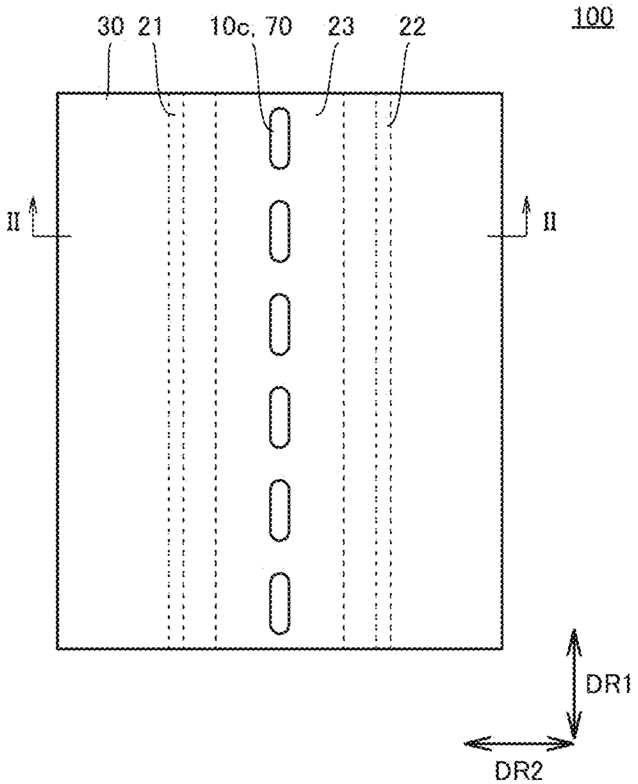
FIG. 1 is a plan view of a printed wiring board 100.

Problem to be Solved by the Present Disclosure

However, in the wiring board described in PTL 1, crosstalk between the first wire pattern and the second wire pattern is not sufficiently suppressed.

The present disclosure has been made in view of the problem of the conventional technique as described above. More specifically, the present disclosure provides a printed wiring board in which crosstalk between a first wire pattern and a second wire pattern can be suppressed.

Advantageous Effect of the Present Disclosure

According to the printed wiring board of the present disclosure, crosstalk between the first wire pattern and the second wire pattern can be suppressed.

DESCRIPTION OF EMBODIMENTS OF THE PRESENT DISCLOSURE

First, embodiments of the present disclosure will be listed and described.

(1) A printed wiring board according to an embodiment includes: a first insulating layer having a first main surface and a second main surface opposite to the first main surface; a first wire pattern, a second wire pattern and a first ground pattern disposed on the second main surface and extending along a first direction in a plan view; a second ground pattern disposed on the first main surface; an adhesive layer disposed on the second main surface so as to cover the first wire pattern, the second wire pattern and the first ground pattern; a second insulating layer disposed on the adhesive layer and having a third main surface facing the adhesive layer side and a fourth main surface opposite to the third main surface; a third ground pattern disposed on the fourth main surface; and a first conductor layer. The first ground pattern is located between the first wire pattern and the second wire pattern in a second direction orthogonal to the first direction, and is spaced apart from the first wire pattern and the second wire pattern. A plurality of first through-holes passing through the first insulating layer, the first ground pattern, the second ground pattern, the adhesive layer, the second insulating layer, and the third ground pattern in a thickness direction are formed in the first insulating layer, the first ground pattern, the second ground pattern, the adhesive layer, the second insulating layer, and the third ground pattern. The plurality of first through-holes are spaced apart from each other and arranged to line up along the first direction. The first conductor layer is disposed on an inner wall surface of each of the plurality of first through-holes, and is electrically connected to the first ground pattern, the second ground pattern and the third ground pattern. A width of each of the plurality of first through-holes in the first direction is greater than a width of each of the plurality of first through-holes in the second direction.

According to the printed wiring board of (1) above, crosstalk between the first wire pattern and the second wire pattern can be suppressed.

(2) In the printed wiring board of (1) above, each of the plurality of first through-holes may extend along the first direction in a plan view.

(3) The printed wiring board of (1) above may further include a second conductor layer. A plurality of second through-holes passing through the first insulating layer, the first ground pattern, the second ground pattern, the adhesive layer, the second insulating layer, and the third ground pattern in the thickness direction may be formed in the first insulating layer, the first ground pattern, the second ground pattern, the adhesive layer, the second insulating layer, and the third ground pattern. The plurality of second through-holes may be spaced apart from each other and arranged to line up along the first direction between a line of the plurality of first through-holes and the second wire pattern. A position of each of the plurality of second through-holes in the first direction may be displaced from a position of each of the plurality of first through-holes in the first direction. The second conductor layer may be disposed on an inner wall surface of each of the plurality of second through-holes and may be electrically connected to the first ground pattern, the second ground pattern and the third ground pattern. A width of each of the plurality of second through-holes in the first direction may be greater than a width of each of the plurality of second through-holes in the second direction.

According to the printed wiring board of (3) above, crosstalk between the first wire pattern and the second wire pattern can be further suppressed.

(4) In the printed wiring board of (3) above, each of the plurality of first through-holes and each of the plurality of second through-holes may extend along the first direction in a plan view.

(5) In the printed wiring board of (3) above, each of the plurality of first through-holes and each of the plurality of second through-holes may have a first portion extending along the first direction in a plan view, and a second portion connected to a central portion of the first portion in the first direction. In each of the plurality of first through-holes, the second portion may extend from the first portion along a direction from the first wire pattern side to the second wire pattern side. In each of the plurality of second through-holes, the second portion may extend from the first portion along a direction from the second wire pattern side to the first wire pattern side.

According to the printed wiring board of (5) above, crosstalk between the first wire pattern and the second wire pattern can be further suppressed.

(6) In the printed wiring board of (3) above, each of the plurality of first through-holes and each of the plurality of second through-holes may have a third portion and a fourth portion extending linearly in a plan view. One end of the third portion and one end of the fourth portion may be connected to each other. The one end of the third portion may be located on one side in the first direction relative to the other end of the third portion. The one end of the fourth portion may be located on the other side in the first direction relative to the other end of the fourth portion. In each of the plurality of first through-holes, the other end of the third portion and the other end of the fourth portion may be located on the second wire pattern side relative to the one end of the third portion and the one end of the fourth portion, respectively. In each of the plurality of second through-holes, the other end of the third portion and the other end of the fourth portion may be located on the first wire pattern side relative to the one end of the third portion and the one end of the fourth portion, respectively.

According to the printed wiring board of (6) above, crosstalk between the first wire pattern and the second wire pattern can be further suppressed.

Details of Embodiments of the Present Disclosure

Details of embodiments of the present disclosure will be described with reference to the drawings. In the drawings below, the same or corresponding parts are denoted by the same reference characters and redundant description will not be repeated.

First Embodiment

A printed wiring board according to a first embodiment will be described. The printed wiring board according to the first embodiment will be referred to as a printed wiring board 100.

<Configuration of Printed Wiring Board 100>

A configuration of printed wiring board 100 will be described below.

Figure 2:
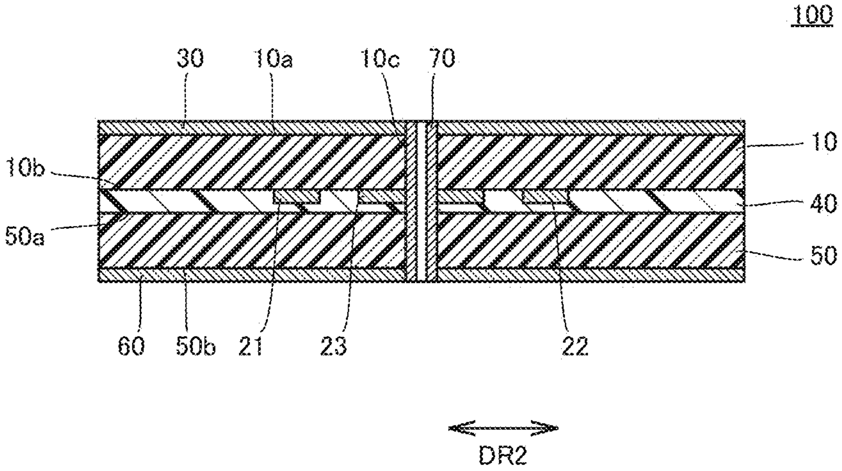
FIG. 2 is a cross-sectional view taken along II-II in FIG. 1.

FIG. 1 is a plan view of printed wiring board 100. FIG. 2 is a cross-sectional view taken along II-II in FIG. 1. As shown in FIGS. 1 and 2, printed wiring board 100 has a first insulating layer 10, a first wire pattern 21, a second wire pattern 22 and a first ground pattern 23, a second ground pattern 30, an adhesive layer 40, a second insulating layer 50, a third ground pattern 60, and a first conductor layer 70.

First insulating layer 10 is made of an electrically insulating material. First insulating layer 10 is made of, for example, polyimide, fluororesin or the like. First insulating layer 10 has a first main surface 10*a* and a second main surface 10*b*. First main surface 10*a* and second main surface 10*b* are end faces of first insulating layer 10 in a thickness direction. Second main surface 10*b* is a surface opposite to first main surface 10*a*.

First wire pattern 21, second wire pattern 22 and first ground pattern 23 are disposed on second main surface 10*b*. Each of first wire pattern 21, second wire pattern 22 and first ground pattern 23 is made of an electrically conductive material. Each of first wire pattern 21, second wire pattern 22 and first ground pattern 23 is made of, for example, copper.

First wire pattern 21, second wire pattern 22 and first ground pattern 23 extend along a first direction DR1 in a plan view. First ground pattern 23 is located between first wire pattern 21 and second wire pattern 22 in a second direction DR2, and is spaced apart from first wire pattern 21 and second wire pattern 22. Second direction DR2 is a direction orthogonal to first direction DR1.

A width of first ground pattern 23 in second direction DR2 is preferably greater than a width of first wire pattern 21 in second direction DR2 and a width of second wire pattern 22 in second direction DR2.

Second ground pattern 30 is made of an electrically conductive material. Second ground pattern 30 is made of, for example, copper. Second ground pattern 30 is disposed on first main surface 10*a*.

Second ground pattern 30 overlaps with first wire pattern 21, second wire pattern 22 and first ground pattern 23 in a plan view. Second ground pattern 30 preferably covers entire first main surface 10*a*.

Adhesive layer 40 is made of, for example, a thermosetting resin material such as an epoxy resin. Adhesive layer 40 is disposed on second main surface 10*b* so as to cover first wire pattern 21, second wire pattern 22 and first ground pattern 23.

Second insulating layer 50 is made of an electrically insulating material. Second insulating layer 50 is made of, for example, polyimide, fluororesin or the like. It is preferable that second insulating layer 50 should be made of the same material as that of first insulating layer 10. Second insulating layer 50 has a third main surface 50*a* and a fourth main surface 50*b*. Third main surface 50*a* and fourth main surface 50*b* are end faces of second insulating layer 50 in the thickness direction. Third main surface 50*a* faces the adhesive layer 40 side. Fourth main surface 50*b* is a surface opposite to third main surface 50*a*.

Third ground pattern 60 is made of an electrically conductive material. Third ground pattern 60 is made of, for example, copper. Third ground pattern 60 is disposed on fourth main surface 50*b*.

Third ground pattern 60 overlaps with first wire pattern 21, second wire pattern 22 and first ground pattern 23 in a plan view. Third ground pattern 60 preferably covers entire fourth main surface 50*b*.

A plurality of first through-holes 10*c* are formed in first insulating layer 10, first ground pattern 23, second ground pattern 30, adhesive layer 40, second insulating layer 50, and third ground pattern 60. First through-holes 10*c* pass through first insulating layer 10, first ground pattern 23, second ground pattern 30, adhesive layer 40, second insulating layer 50, and third ground pattern 60 in the thickness direction.

The plurality of first through-holes 10*c* are spaced apart from each other and arranged to line up along first direction DR1 in a plan view. An interval between first through-holes 10*c* adjacent to each other in first direction DR1 is constant, for example.

A width of each of first through-holes 10*c* in first direction DR1 is greater than a width of each of first through-holes 10*c* in second direction DR2. Each of first through-holes 10*c* extends along first direction DR1, for example. Each of first through-holes 10*c* preferably has such an elliptical shape that a longitudinal direction is along first direction DR1 in a plan view.

First conductor layer 70 is a layer formed by plating, for example. First conductor layer 70 is made of, for example, copper. First conductor layer 70 is disposed on an inner wall surface of each of first through-holes 10*c*. First conductor layer 70 may be filled into each of first through-holes 10*c*. First ground pattern 23, second ground pattern 30 and third ground pattern 60 are electrically connected to each other by first conductor layer 70.

<Method for Manufacturing Printed Wiring Board 100>

A method for manufacturing printed wiring board 100 will be described below.

Figure 3:
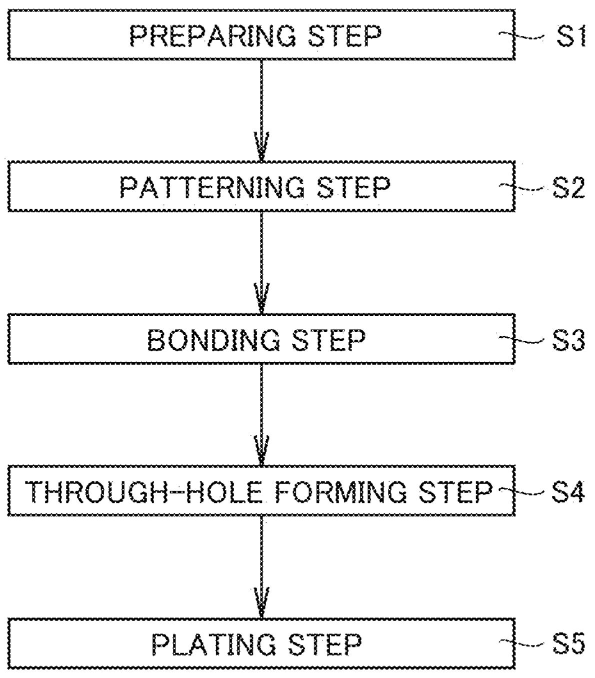
FIG. 3 is a process diagram showing a method for manufacturing printed wiring board 100.

FIG. 3 is a process diagram showing the method for manufacturing printed wiring board 100. As shown in FIG. 3, the method for manufacturing printed wiring board 100 has a preparing step S1, a patterning step S2, a bonding step S3, a through-hole forming step S4, and a plating step S5.

Figure 4:
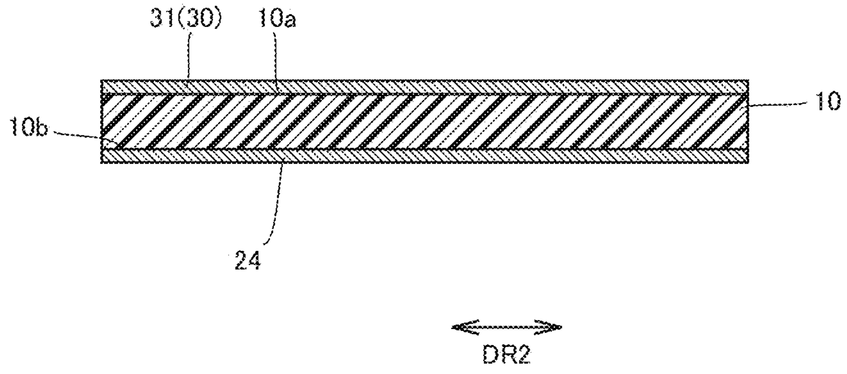
FIG. 4 is a cross-sectional view illustrating a preparing step S1.

FIG. 4 is a cross-sectional view illustrating preparing step S1. As shown in FIG. 4, in preparing step S1, first insulating layer 10 is prepared. A copper foil 31 and a copper foil 24 are disposed on first main surface 10*a* and on second main surface 10*b* of first insulating layer 10 prepared in preparing step S1, respectively. Copper foil 31 will form second ground pattern 30.

Figure 5:
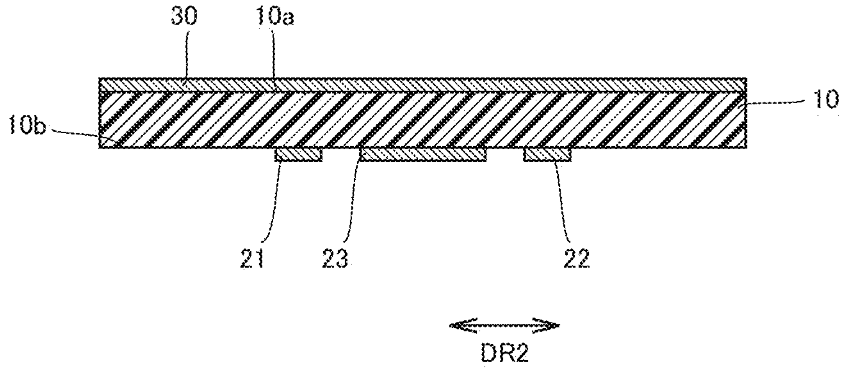
FIG. 5 is a cross-sectional view illustrating a patterning step S2.

FIG. 5 is a cross-sectional view illustrating patterning step S2. As shown in FIG. 5, in patterning step S2, copper foil 24 is patterned, and first wire pattern 21, second wire pattern 22 and first ground pattern 23 are thereby formed.

In patterning of copper foil 24, a dry film resist is first attached onto copper foil 24. Secondly, the attached dry film resist is developed and exposed. Thirdly, copper foil 24 is etched using the developed and exposed dry film resist as a mask, and first wire pattern 21, second wire pattern 22 and first ground pattern 23 are thereby formed.

Figure 6:
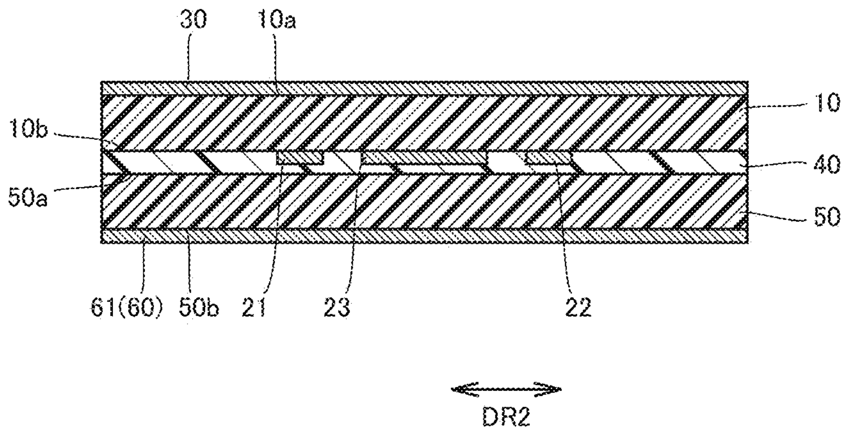
FIG. 6 is a cross-sectional view illustrating a bonding step S3.

FIG. 6 is a cross-sectional view illustrating bonding step S3. As shown in FIG. 6, in bonding step S3, second insulating layer 50 having a copper foil 61 disposed on fourth main surface 50*b* is attached to first insulating layer 10 using adhesive layer 40. Copper foil 61 will form third ground pattern 60.

Figure 7:
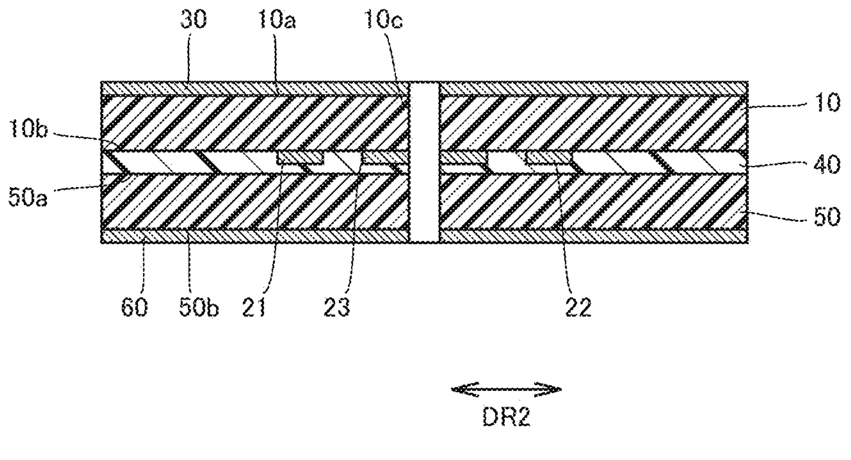
FIG. 7 is a cross-sectional view illustrating a through-hole forming step S4.

FIG. 7 is a cross-sectional view illustrating through-hole forming step S4. As shown in FIG. 7, in through-hole forming step S4, first through-hole 10*c* is formed. First through-hole 10*c* is formed by irradiation with a laser beam, for example.

In plating step S5, plating is performed, and first conductor layer 70 is thereby formed on the inner wall surface of first through-hole 10*c*. The plating is performed by an electroless plating method or an electrolytic plating method. As described above, printed wiring board 100 having the structure shown in FIGS. 1 and 2 is manufactured.

<Effect of Printed Wiring Board 100>

The effect of printed wiring board 100 will be described below.

When a signal is transmitted through first wire pattern 21 and second wire pattern 22 (when a current flows through first wire pattern 21 and second wire pattern 22), electromagnetic waves are emitted from first wire pattern 21 and second wire pattern 22.

The electromagnetic wave emitted from first wire pattern 21 causes noise to the signal transmitted through second wire pattern 22, and the electromagnetic wave emitted from second wire pattern 22 causes noise to the signal transmitted through first wire pattern 21. In other words, crosstalk occurs between first wire pattern 21 and second wire pattern 22.

First conductor layer 70 is electrically connected to first ground pattern 23, second ground pattern 30 and third ground pattern 60. Therefore, in printed wiring board 100, a part of the electromagnetic wave emitted from first wire pattern 21 toward second wire pattern 22 and a part of the electromagnetic wave emitted from second wire pattern 22 toward first wire pattern 21 are blocked by first conductor layer 70 disposed on the inner wall surface of each of first through-holes 10*c*.

In printed wiring board 100, the width of each of first through-holes 10*c* in first direction DR1 is greater than the width of each of first through-holes 10*c* in second direction DR2. Therefore, first through-holes 10*c* can be formed densely in first direction DR1, without making the interval between adjacent two first through-holes 10*c* smaller. As described above, according to printed wiring board 100, crosstalk between first wire pattern 21 and second wire pattern 22 is suppressed.

Modification

Figure 8:
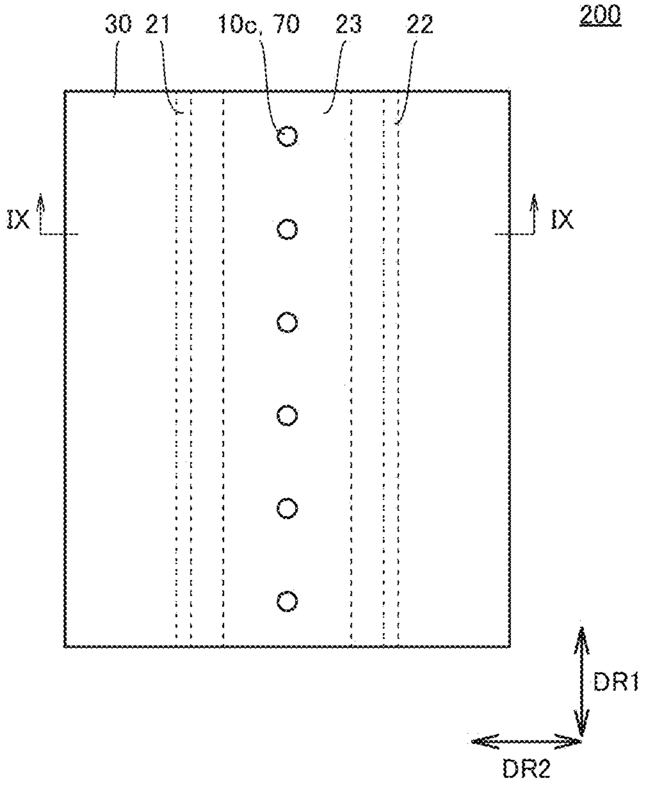
FIG. 8 is a plan view of a printed wiring board 200.
Figure 9:
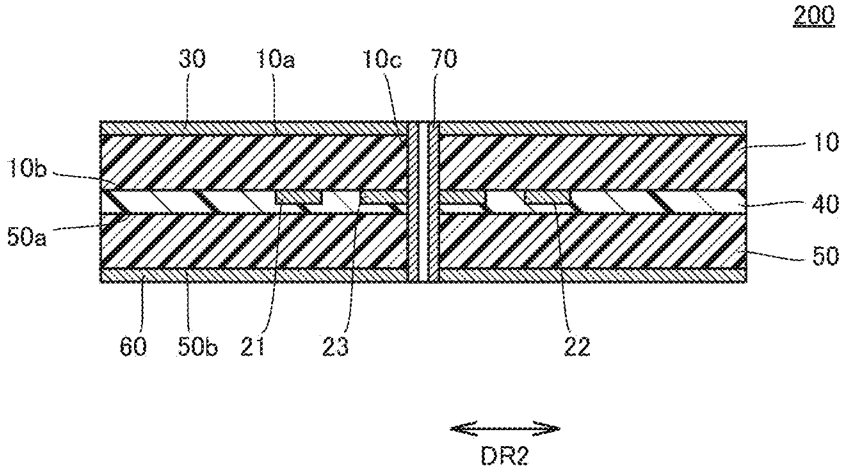
FIG. 9 is a cross-sectional view taken along IX-IX in FIG. 8.

Printed wiring board 100 according to a modification will be referred to as a printed wiring board 200. FIG. 8 is a plan view of printed wiring board 200. FIG. 9 is a cross-sectional view taken along IX-IX in FIG. 8. As shown in FIGS. 8 and 9, printed wiring board 200 has first insulating layer 10, first wire pattern 21, second wire pattern 22 and first ground pattern 23, second ground pattern 30, adhesive layer 40, second insulating layer 50, third ground pattern 60, and first conductor layer 70.

In printed wiring board 200, each of first through-holes 10*c* has a circular shape in a plan view. In other words, in printed wiring board 200, a width of each of first through-holes 10*c* in second direction DR2 is equal to a width of each of first through-holes 10*c* in first direction DR1. In printed wiring board 200 as well, a part of the electromagnetic wave emitted from first wire pattern 21 toward second wire pattern 22 and a part of the electromagnetic wave emitted from second wire pattern 22 toward first wire pattern 21 are blocked by first conductor layer 70 disposed on the inner wall surface of each of first through-holes 10*c*, and thus, crosstalk between first wire pattern 21 and second wire pattern 22 is suppressed.

Second Embodiment

A printed wiring board according to a second embodiment will be described. The printed wiring board according to the second embodiment will be referred to as a printed wiring board 100A. Here, differences from printed wiring board 100 will be mainly described, and redundant description will not be repeated.

<Configuration of Printed Wiring Board 100A>

A configuration of printed wiring board 100A will be described below.

Figure 10:
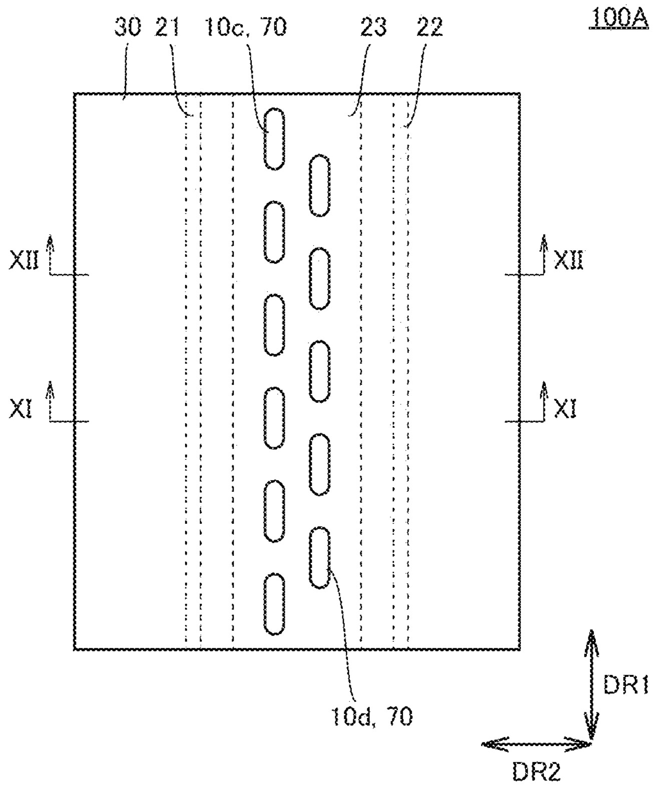
FIG. 10 is a plan view of a printed wiring board 100A.
Figure 11:
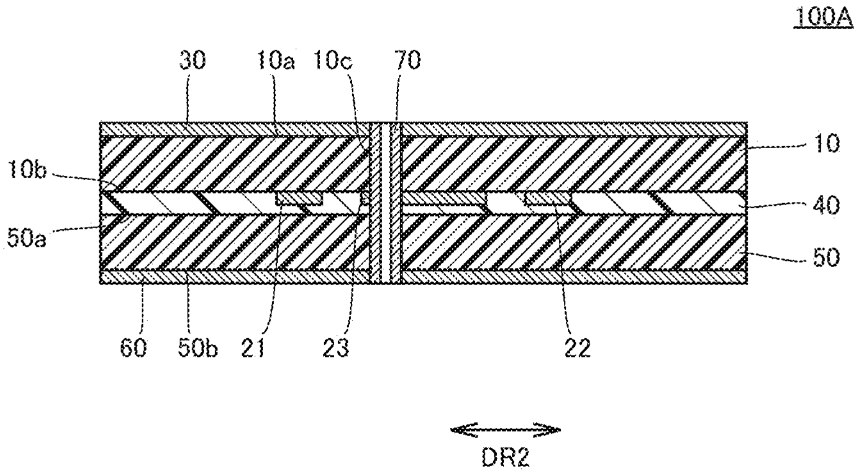
FIG. 11 is a cross-sectional view taken along XI-XI in FIG. 10.
Figure 12:
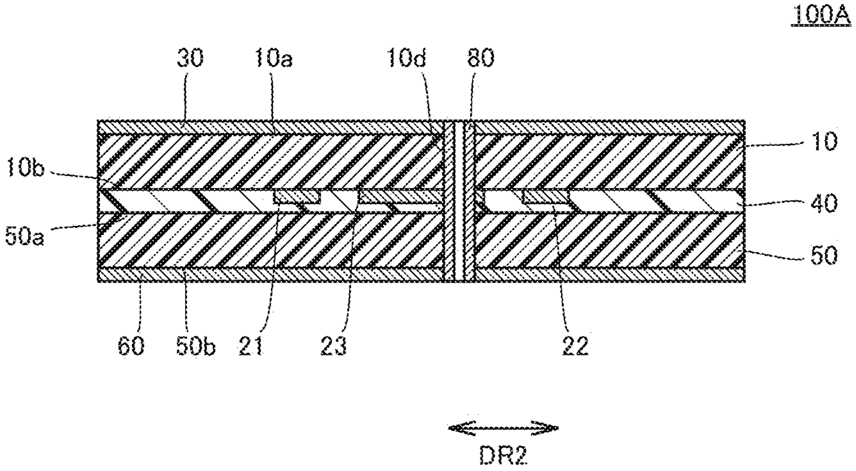
FIG. 12 is a cross-sectional view taken along XII-XII in FIG. 10.

FIG. 10 is a plan view of printed wiring board 100A. FIG. 11 is a cross-sectional view taken along XI-XI in FIG. 10. FIG. 12 is a cross-sectional view taken along XII-XII in FIG. 10. As shown in FIGS. 10, 11 and 12, printed wiring board 100A has first insulating layer 10, first wire pattern 21, second wire pattern 22 and first ground pattern 23, second ground pattern 30, adhesive layer 40, second insulating layer 50, third ground pattern 60, and first conductor layer 70. In this regard, the configuration of printed wiring board 100A is common to the configuration of printed wiring board 100.

Printed wiring board 100A further has a second conductor layer 80. In printed wiring board 100A, a plurality of second through-holes 10*d* are formed in first insulating layer 10, first ground pattern 23, second ground pattern 30, adhesive layer 40, second insulating layer 50, and third ground pattern 60.

Second through-holes 10*d* pass through first insulating layer 10, first ground pattern 23, second ground pattern 30, adhesive layer 40, second insulating layer 50, and third ground pattern 60 in the thickness direction. The plurality of second through-holes 10*d* are spaced apart from each other and disposed to line up along first direction DR1. An interval between adjacent two second through-holes 10*d* is constant, for example.

A line of second through-holes 10*d* is disposed between a line of first through-holes 10*c* and second wire pattern 22 in a plan view. A position of each of second through-holes 10*d* in first direction DR1 is displaced from a position of each of first through-holes 10*c* in first direction DR1.

A width of each of second through-holes 10*d* in first direction DR1 is greater than a width of each of second through-holes 10*d* in second direction DR2. Each of second through-holes 10*d* extends along first direction DR1, for example. Each of second through-holes 10*d* preferably has such an elliptical shape that a longitudinal direction is along first direction DR1 in a plan view. In a plan view, each of second through-holes 10*d* may have the same shape as that of each of first through-holes 10*c*, or may have a different shape from that of each of first through-holes 10*c*.

Second conductor layer 80 is a layer formed by plating, for example. Second conductor layer 80 is made of, for example, copper. Second conductor layer 80 is disposed on an inner wall surface of each of second through-holes 10*d*. Second conductor layer 80 may be filled into each of second through-holes 10*d*. First ground pattern 23, second ground pattern 30 and third ground pattern 60 are electrically connected to each other by second conductor layer 80. In these regards, the configuration of printed wiring board 100A is different from the configuration of printed wiring board 100.

<Method for Manufacturing Printed Wiring Board 100A>

A method for manufacturing printed wiring board 100A will be described below.

The method for manufacturing printed wiring board 100A has preparing step S1, patterning step S2, bonding step S3, through-hole forming step S4, and plating step S5. In this regard, the method for manufacturing printed wiring board 100A is common to the method for manufacturing printed wiring board 100.

In the method for manufacturing printed wiring board 100A, in through-hole forming step S4, second through-holes 10*d* are also formed, in addition to first through-holes 10*c*. In the method for manufacturing printed wiring board 100A, in plating step S5, second conductor layer 80 is also formed, in addition to first conductor layer 70. In these regards, the method for manufacturing printed wiring board 100A is different from the method for manufacturing printed wiring board 100.

<Effect of Printed Wiring Board 100A>

The effect of printed wiring board 100A will be described below.

In printed wiring board 100, the electromagnetic wave emitted from first wire pattern 21 and the electromagnetic wave emitted from second wire pattern 22 may in some cases pass through a space between adjacent two first through-holes 10*c*.

In printed wiring board 100A, the position of each of second through-holes 10*d* in first direction DR1 is displaced from the position of each of first through-holes 10*c* in first direction DR1. Therefore, in printed wiring board 100A, the electromagnetic wave emitted from first wire pattern 21 is blocked by second conductor layer 80 disposed on the inner wall surface of each of second through-holes 10*d*, even if the electromagnetic wave passes through a space between adjacent two first through-holes 10*c*. Similarly, in printed wiring board 100A, the electromagnetic wave emitted from second wire pattern 22 is blocked by first conductor layer 70 disposed on the inner wall surface of each of first through-holes 10*c*, even if the electromagnetic wave passes through a space between adjacent two second through-holes 10*d*.

Therefore, according to printed wiring board 100A, crosstalk between first wire pattern 21 and second wire pattern 22 is further suppressed, as compared with printed wiring board 100.

Third Embodiment

A printed wiring board according to a third embodiment will be described. The printed wiring board according to the third embodiment will be referred to as a printed wiring board 100B. Here, differences from printed wiring board 100A will be mainly described, and redundant description will not be repeated.

<Configuration of Printed Wiring Board 100B>

A configuration of printed wiring board 100B will be described below.

Figure 13:
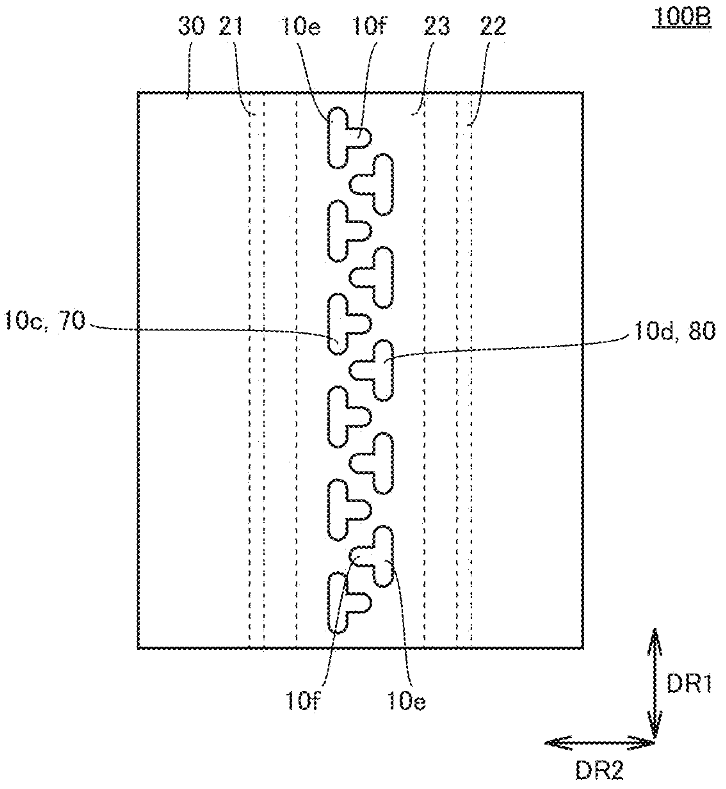
FIG. 13 is a plan view of a printed wiring board 100B.

FIG. 13 is a plan view of printed wiring board 100B. As shown in FIG. 13, printed wiring board 100B has first insulating layer 10, first wire pattern 21, second wire pattern 22 and first ground pattern 23, second ground pattern 30, adhesive layer 40, second insulating layer 50, third ground pattern 60, first conductor layer 70, and second conductor layer 80. In this regard, the configuration of printed wiring board 100B is common to the configuration of printed wiring board 100A.

In printed wiring board 100B, each of first through-holes 10*c* and each of second through-holes 10*d* have a first portion 10*e* and a second portion 10*f*. First portion 10*e* extends along first direction DR1. Second portion 10*f* extends along second direction DR2. Second portion 10*f* is connected to a central portion of first portion 10*e* in first direction DR1.

In each of first through-holes 10*c*, second portion 10*f* extends from first portion 10*e* along a direction from first wire pattern 21 to second wire pattern 22. In each of second through-holes 10*d*, second portion 10*f* extends from first portion 10*e* along a direction from second wire pattern 22 to first wire pattern 21. In these regards, the configuration of printed wiring board 100B is different from the configuration of printed wiring board 100A.

<Method for Manufacturing Printed Wiring Board 100B>

A method for manufacturing printed wiring board 100B will be described below.

The method for manufacturing printed wiring board 100B has preparing step S1, patterning step S2, bonding step S3, through-hole forming step S4, and plating step S5. In this regard, the method for manufacturing printed wiring board 100B is common to the method for manufacturing printed wiring board 100A.

The method for manufacturing printed wiring board 100B is different from the method for manufacturing printed wiring board 100A in terms of the shape of each of first through-holes 10*c* and each of second through-holes 10*d* formed in through-hole forming step S4.

<Effect of Printed Wiring Board 100B>

The effect of printed wiring board 100B will be described below.

In printed wiring board 100A, the electromagnetic wave emitted from first wire pattern 21 and the electromagnetic wave emitted from second wire pattern 22 may in some cases pass through a space between adjacent two first through-holes 10*c* and a space between adjacent two second through-holes 10*d* along a direction inclined with respect to second direction DR2.

In printed wiring board 100B, each of second through-holes 10*d* has second portion 10*f*. Therefore, the electromagnetic wave emitted from first wire pattern 21 is easily blocked by second conductor layer 80 disposed on the inner wall surface of each of second through-holes 10*d* in second portion 10*f*, even if the electromagnetic wave passes through a space between adjacent two first through-holes 10*c*. In printed wiring board 100B, each of first through-holes 10*c* has second portion 10*f*. Therefore, the electromagnetic wave emitted from second wire pattern 22 is easily blocked by first conductor layer 70 disposed on the inner wall surface of each of first through-holes 10*c* in second portion 10*f*, even if the electromagnetic wave passes through a space between adjacent two second through-holes 10*d*.

As described above, according to printed wiring board 100B, crosstalk between first wire pattern 21 and second wire pattern 22 is further suppressed, as compared with printed wiring board 100A.

Fourth Embodiment

A printed wiring board according to a fourth embodiment will be described. The printed wiring board according to the fourth embodiment will be referred to as a printed wiring board 100C. Here, differences from printed wiring board 100A will be mainly described, and redundant description will not be repeated.

<Configuration of Printed Wiring Board 100C>

A configuration of printed wiring board 100C will be described below.

Figure 14:
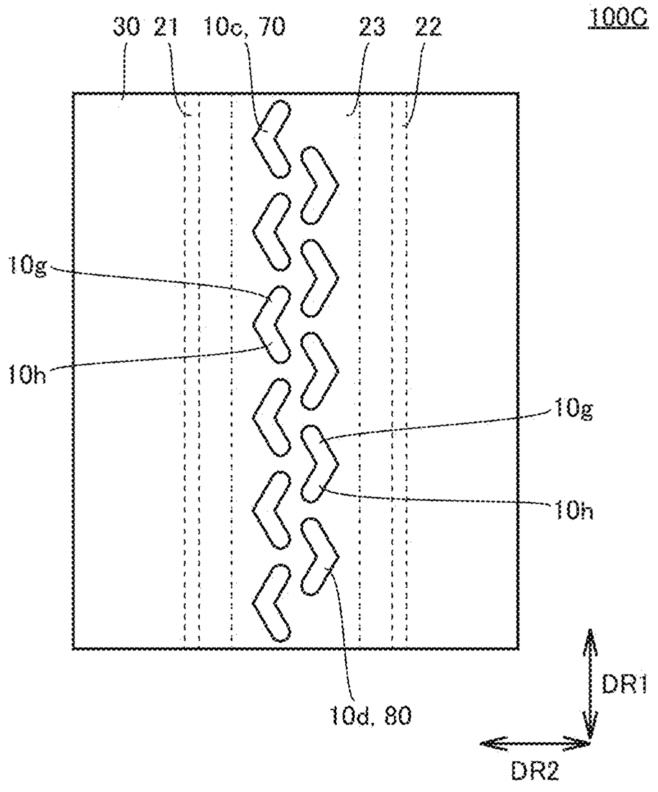
FIG. 14 is a plan view of a printed wiring board 100C.

FIG. 14 is a plan view of printed wiring board 100C. As shown in FIG. 14, printed wiring board 100C has first insulating layer 10, first wire pattern 21, second wire pattern 22 and first ground pattern 23, second ground pattern 30, adhesive layer 40, second insulating layer 50, third ground pattern 60, first conductor layer 70, and second conductor layer 80. In this regard, the configuration of printed wiring board 100C is common to the configuration of printed wiring board 100A.

In printed wiring board 100C, each of first through-holes 10*c* and each of second through-holes 10*d* have a third portion 10*g* and a fourth portion 10*h* extending linearly in a plan view. One end of third portion 10*g* and one end of fourth portion 10*h* are connected to each other. The one end of third portion 10*g* is located on one side in first direction DR1 relative to the other end of third portion 10*g*. The one end of fourth portion 10*h* is located on the other side in first direction DR1 relative to the other end of fourth portion 10*h*.

In each of first through-holes 10*c*, the other end of third portion 10*g* and the other end of fourth portion 10*h* are located on the second wire pattern 22 side relative to the one end of third portion 10*g* and the one end of fourth portion 10*h*, respectively. In each of second through-holes 10*d*, the other end of third portion 10*g* and the other end of fourth portion 10*h* are located on the first wire pattern 21 side relative to the one end of third portion 10*g* and the one end of fourth portion 10*h*, respectively. In other words, each of first through-holes 10*c* and each of second through-holes 10*d* have an L shape in a plan view. In these regards, the configuration of printed wiring board 100C is different from the configuration of printed wiring board 100A.

<Method for Manufacturing Printed Wiring Board 100C>

A method for manufacturing printed wiring board 100C will be described below.

The method for manufacturing printed wiring board 100C has preparing step S1, patterning step S2, bonding step S3, through-hole forming step S4, and plating step S5. In this regard, the method for manufacturing printed wiring board 100C is common to the method for manufacturing printed wiring board 100A.

The method for manufacturing printed wiring board 100C is different from the method for manufacturing printed wiring board 100A in terms of the shape of each of first through-holes 10*c* and each of second through-holes 10*d* formed in through-hole forming step S4.

<Effect of Printed Wiring Board 100C>

The effect of printed wiring board 100C will be described below.

In printed wiring board 100A, the electromagnetic wave emitted from first wire pattern 21 and the electromagnetic wave emitted from second wire pattern 22 may in some cases pass through a space between adjacent two first through-holes 10*c* and a space between adjacent two second through-holes 10*d* along the direction inclined with respect to second direction DR2.

In contrast, in printed wiring board 100C, the electromagnetic wave emitted from first wire pattern 21 is easily blocked by second conductor layer 80 disposed on the inner wall surface of each of second through-holes 10*d* in third portion 10*g* and fourth portion 10*h*, even if the electromagnetic wave passes through a space between adjacent two first through-holes 10*c*. In printed wiring board 100C, the electromagnetic wave emitted from second wire pattern 22 is easily blocked by first conductor layer 70 disposed on the inner wall surface of each of first through-holes 10*c* in third portion 10*g* and fourth portion 10*h*, even if the electromagnetic wave passes through a space between adjacent two second through-holes 10*d*.

As described above, according to printed wiring board 100C, crosstalk between first wire pattern 21 and second wire pattern 22 is further suppressed, as compared with printed wiring board 100A.

It should be understood that the embodiments disclosed herein are illustrative and non-restrictive in every respect. The scope of the present invention is defined by the terms of the claims, rather than the embodiments above, and is intended to include any modifications within the scope and meaning equivalent to the terms of the claims.

REFERENCE SIGNS LIST

10 first insulating layer; 10*a* first main surface; 10*b* second main surface; 10*c* first through-hole; 10*d* second through-hole; 10*e* first portion; 10*f* second portion; 10*g* third portion; 10*h* fourth portion; 21 first wire pattern; 22 second wire pattern; 23 first ground pattern; 24 copper foil; 30 second ground pattern; 31 copper foil; 40 adhesive layer; 50 second insulating layer; 50*a* third main surface; 50*b* fourth main surface; 60 third ground pattern; 61 copper foil; 70 first conductor layer; 80 second conductor layer; 100 printed wiring board; 100A, 100B, 100C, 200 printed wiring board; DR1 first direction; DR2 second direction; S1 preparing step; S2 patterning step; S3 bonding step; S4 through-hole forming step; S5 plating step.

The invention claimed is:

1. A printed wiring board comprising:

a first insulating layer having a first main surface and a second main surface opposite to the first main surface;

a first wire pattern, a second wire pattern and a first ground pattern disposed on the second main surface and extending along a first direction in a plan view;

a second ground pattern disposed on the first main surface;

an adhesive layer disposed on the second main surface so as to cover the first wire pattern, the second wire pattern and the first ground pattern;

a second insulating layer disposed on the adhesive layer and having a third main surface facing the adhesive layer side and a fourth main surface opposite to the third main surface;

a third ground pattern disposed on the fourth main surface; and a first conductor layer, which is a copper plating layer, wherein the first ground pattern is located between the first wire pattern and the second wire pattern in a second direction orthogonal to the first direction, and is spaced apart from the first wire pattern and the second wire pattern, a plurality of first through-holes passing through the first insulating layer, the first ground pattern, the second ground pattern, the adhesive layer, the second insulating layer and the third ground pattern in a thickness direction are formed in the first insulating layer, the first ground pattern, the second ground pattern, the adhesive layer, the second insulating layer, and the third ground pattern, the plurality of first through-holes are spaced apart from each other and arranged to line up along the first direction, the first conductor layer is disposed on an inner wall surface of each of the plurality of first through-holes, and is electrically connected to the first ground pattern, the second ground pattern and the third ground pattern, and a width of each of the plurality of first through-holes in the first direction is greater than a width of each of the plurality of first through-holes in the second direction.

2. The printed wiring board according to claim 1, wherein each of the plurality of first through-holes extends along the first direction in a plan view.

3. The printed wiring board according to claim 1, further comprising a second conductor layer, wherein a plurality of second through-holes passing through the first insulating layer, the first ground pattern, the second ground pattern, the adhesive layer, the second insulating layer, and the third ground pattern in the thickness direction are formed in the first insulating layer, the first ground pattern, the second ground pattern, the adhesive layer, the second insulating layer, and the third ground pattern, the plurality of second through-holes are spaced apart from each other and arranged to line up along the first direction between a line of the plurality of first through-holes and the second wire pattern, a position of each of the plurality of second through-holes in the first direction is displaced from a position of each of the plurality of first through-holes in the first direction, the second conductor layer is disposed on an inner wall surface of each of the plurality of second through-holes and is electrically connected to the first ground pattern, the second ground pattern and the third ground pattern, and a width of each of the plurality of second through-holes in the first direction is greater than a width of each of the plurality of second through-holes in the second direction.

4. The printed wiring board according to claim 3, wherein each of the plurality of first through-holes and each of the plurality of second through-holes extend along the first direction in a plan view.

5. The printed wiring board according to claim 3, wherein each of the plurality of first through-holes and each of the plurality of second through-holes have a first portion extending along the first direction in a plan view, and a second portion connected to a central portion of the first portion in the first direction, in each of the plurality of first through-holes, the second portion extends from the first portion along a direction from the first wire pattern side to the second wire pattern side, and in each of the plurality of second through-holes, the second portion extends from the first portion along a direction from the second wire pattern side to the first wire pattern side.

6. The printed wiring board according to claim 3, wherein each of the plurality of first through-holes and each of the plurality of second through-holes have a third portion and a fourth portion extending linearly in a plan view, one end of the third portion and one end of the fourth portion are connected to each other, the one end of the third portion is located on one side in the first direction relative to the other end of the third portion, the one end of the fourth portion is located on the other side in the first direction relative to the other end of the fourth portion, in each of the plurality of first through-holes, the other end of the third portion and the other end of the fourth portion are located on the second wire pattern side relative to the one end of the third portion and the one end of the fourth portion, respectively, and in each of the plurality of second through-holes, the other end of the third portion and the other end of the fourth portion are located on the first wire pattern side relative to the one end of the third portion and the one end of the fourth portion, respectively.

* * * * *